United States Patent [19]

Mayes

[11] Patent Number: 5,601,965
[45] Date of Patent: Feb. 11, 1997

[54] INCREASING ADHESION OF DRY FILM PHOTOPOLYMERIZABLE COMPOSITIONS

[75] Inventor: Richard T. Mayes, Newark, Del.

[73] Assignee: MacDermid Imaging Technology, Inc., Waterbury, Conn.

[21] Appl. No.: 650,213

[22] Filed: May 20, 1996

Related U.S. Application Data

[63] Continuation of Ser. No. 562,315, Nov. 22, 1995, abandoned, which is a continuation of Ser. No. 786,632, Nov. 1, 1991, abandoned.

[51] Int. Cl.$^6$ ........................................ G03C 1/72
[52] U.S. Cl. ........................ 430/281.1; 430/909
[58] Field of Search .................. 430/270.1, 271.1, 430/281.1, 285.1, 325, 907, 909

[56] References Cited

U.S. PATENT DOCUMENTS

| | | |
|---|---|---|
| 3,943,103 | 3/1976 | Borden et al. . |
| 3,984,244 | 10/1976 | Collier et al. . |
| 3,996,394 | 12/1976 | Harris . |
| 4,228,232 | 10/1980 | Rousseau ........................ 430/271 |
| 4,371,566 | 2/1983 | Russel . |
| 4,482,625 | 11/1984 | Namiki et al. .................. 430/143 |
| 5,124,234 | 6/1992 | Wakata et al. .................. 430/280 |

FOREIGN PATENT DOCUMENTS

| | | |
|---|---|---|
| 0041640 | 12/1981 | European Pat. Off. . |
| 0233623 | 8/1987 | European Pat. Off. . |
| 1441182 | 6/1976 | United Kingdom . |

OTHER PUBLICATIONS

Union Carbide Chemicals and Plastics Company Inc., *UCAR® Solution for Coatings*, 1990.

*Primary Examiner*—Kathleen Duda
*Attorney, Agent, or Firm*—John L. Cordani

[57] ABSTRACT

An aqueous-developable dry-film photopolymerizable composition is disclosed wherein the photopolymerizable composition contains a hydroxyl-modified vinyl chloride/vinyl acetate polymer.

17 Claims, No Drawings

INCREASING ADHESION OF DRY FILM PHOTOPOLYMERIZABLE COMPOSITIONS

This application is a continuation of application Ser. No. 08/562,315, filed Nov. 22, 1995, now abandoned which is a continuation of application Ser. No. 07/786,632 filed Nov. 1, 1991 now abandoned.

The present invention relates to aqueous-developable dry-film photopolymerizable compositions useful as photoresists. In particular it relates to such compositions supported on a polyester carrier.

Aqueous-developable dry-film photopolymerizable compositions can be used in the manufacture of printed circuit boards as photoresists. In typical use, a dry-film photopolymerizable composition is applied to a copper-clad substrate, exposed in certain areas to actinic radiation that will cure the film, and then washed with an alkaline aqueous solution to remove the unexposed film from the copper. The exposed copper surface can then be removed in etching solutions leaving the protected area under the cured photopolymerizable composition to form the electrical circuit.

Dry-film photopolymerizable compositions are typically made by combining the necessary components in a solvent, applying the solvated materials to a transparent carrier, such as a polyester film, and then evaporating the solvent. The dried material remaining on the carrier is the dry-film photopolymerizable composition. A flexible cover film can then be applied over the photopolymerizable composition for storage and shipping, preferably as rolls of the material. In use, the cover film is removed from the resist and the carrier is then radiation through the carrier, which is only removed after the film is cured.

Photopolymerizable compositions intended as photoresists are preferably designed to keep exposure time and development time to a minimum. It is also important that the photopolymerizable composition is preferentially adhesive to the carrier material as opposed to the cover material. Otherwise, when the cover is removed, part of the photopolymerizable composition can also be removed from the carrier. On the other had, the photopolymerizable composition cannot be too adhesive to the carrier, otherwise it is possible that the cured composition might be lifted from the substrate after curing when the carrier is removed.

A problem in photopolymerizable compositions is that a delicate balance of ingredients must be maintained in order to ensure that the aforesaid characteristics are achieved. Materials that advantageously affect exposure time or development time might easily adversely affect the preferentially adhesive character of the composition. Furthermore, typical carriers, such as polyester film, exhibit a smooth surface, which makes adhesion thereto all the more difficult to control.

Accordingly, the present invention provides in an aqueous-developable dry-film photopolymerizable composition the improvement wherein the photopolymerizable composition further comprises hydroxyl-modified vinyl chloride/vinyl acetate polymer. The present invention also provides an article comprising the dry-film photopolymerizable composition disposed on a carrier. The present invention further provides in a method of using an aqueous-developable dry-film photopolymerizable composition comprising the steps of applying to a substrate the photopolymerizable composition disposed on a carrier, imagewise exposing (that is, exposing through a negative) the photopolymerizable composition through the carrier to actinic radiation sufficient to cure the photopolymerizable composition in exposed areas, removing the carrier from the photopolymerizable composition, and washing the photopolymerizable composition with an alkaline aqueous solution to remove uncured photopolymerizable composition from the substrate, the improvement wherein the photopolymerizable composition contains a hydroxyl-modified vinyl chloride/vinyl acetate polymer.

The hydroxyl-modified vinyl chloride/vinyl acetate polymer useful in accordance with the present invention preferably contains 1–15 weight % hydroxyl groups, more preferably 2–4 weight %. Preferred hydroxyl-modified vinyl chloride/vinyl acetate copolymers are made using 55–95 weight %, more preferably 85–95 weight % vinyl chloride monomers and 3–10 weight %, more preferably 5–6 weight %, vinyl acetate monomers. Hydroxyl-modified vinyl chloride/vinyl acetate copolymers are well known, and can be made by reacting vinyl chloride and vinyl acetate monomers and hydrolyzing the resulting resin or by directly polymerizing vinyl chloride, vinyl acetate, and hydroxyalkyl acrylate monomers. Examples include hydroxyl-modified vinyl chloride/vinyl acetate copolymers and hydroxyl-modified vinyl chloride/vinyl acetate alkyl ($C_1$–$C_{12}$) acrylate terpolymers as disclosed in U.S. Pat. Nos. 2,512,726, 2,329,456, 3,943,103, and 3,996,394, the disclosures of which are incorporated herein by reference. The amount of hydroxyl-modified vinyl chloride/vinyl acetate polymer useful in accordance with the present invention based on the total weight of the dry-film photopolymerizable composition varies from 0.25–4.5%, more preferably from 0.5–2% and most preferably from 0.5–1%. Adhesion of the photopolymerizable composition to the carrier is varied by varying the concentration of the hydroxyl-modified vinyl chloride/vinyl acetate polymer. This is advantageous since a relatively small amount of polymer is needed to give adequate adhesion. This is important since a large concentration of an additive generally negatively affects overall performance of the photopolymerizable composition.

Dry-film photopolymerizable compositions are well known in the art, and specific components and amounts thereof in addition to the hydroxyl-modified vinyl chloride/vinyl acetate copolymer that are useful in accordance with the present invention will be readily apparent to the skilled artisan. "Dry" films are those in which the solvent has been evaporated. In a preferred embodiment of the present invention, the photopolymerizable composition includes a carboxyl group-containing, film-forming polymeric binder, a free-radical photoinitiator, a polyfunctional addition-polymerizable monomer, a plasticizer, and a thermal polymerization inhibitor in addition to the hydroxyl-modified vinyl chloride/vinyl acetate polymer. In the preferred embodiment, based on the total weight of the dry-film photopolymerizable composition, the amount of polymeric binder varies from 30–75% , more preferably from 45–60% , the amount of photoinitiator varies from 2–10%, more preferably from 3–7%, the amount of addition-polymerizable monomer varies from 5–40%, more preferably 15–25%, the amount of plasticizer varies from 2–30%, more preferably from 9–15%, and the amount of thermal polymerization inhibitor varies from 0.003%–0.04% more preferably from 0.01%–0.02%. In particular, the hydroxyl-modified vinyl chloride/vinyl acetate polymer is useful in photopolymerizable compositions containing polymeric binders having a glass transition temperature ($T_g$) greater than 25° C., as such binders impart a glassy surface to the dry-film making adhesion to the transparent carrier difficult, more particularly when the carrier used is made of polyester.

Plasticizers useful in accordance with the present invention include, for example, simple plasticizers such as tri-n-butyl citrate, N-ethyl-toluene sulfonamide, and glycerol triacetate, as well as polymeric materials such as carboxyl-modified polyurethanes.

The free-radical photoinitiator useful in accordance with this invention is a conventional photoinitiator activatable by actinic radiation that is thermally inactive below about 185° C. Examples of useful photoinitiators are found in U.S. Pat. No. 4,268,610, incorporated herein by reference. Exemplary photoinitiators are aromatic ketones, such as benzophenone and dimethoxyphenyl acetophenone. Other useful photoinitiators will be apparent to those skilled in the art.

The polyfunctional addition-polymerizable monomer that finds application in the subject invention is nongaseous, contains at least 2, preferably 2 to 4, more preferably 2 to 3 ethylenic double bonds. Having at least 2 ethylenic double bonds makes the monomer polyfunctional, i.e., capable of cross-linked polymerization. Suitable monomers include alkylene or polyalkylene glycol diacrylates. Monomers containing vinylidene groups conjugated with ester linkages are particularly suitable. Illustrative examples include but are not limited to ethylene diacrylate; diethylene glycol diacrylate; glycerol diacrylate; glycerol triacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tri- and tetraacrylate; tetraethylene glycol dimethacrylate; trimethylolpropane trimethacrylate; triethylene glycol diacrylate; tetraethylene glycol diacrylate; pentaerythritol triacrylate; trimethylol propane triacrylate; pentaerythritol tetraacrylate; 1,3-propanediol diacrylate; 1,5-pentanediol dimethacrylate; and the bis-acrylates and bis-methacrylates of polyethylene glycols, polypropylene glycols, and copolymers thereof of molecular weight from about 100 to about 500 (number average). Other useful polymerizable monomers will be apparent to those skilled in the art.

The thermal polymerization inhibitor useful in accordance with the instant invention prevents thermal polymerization during drying and storage. Examples of useful thermal polymerization inhibitors are p-methoxyphenol, hydroquinone, alkyl and aryl-substituted hydroquinones and quinones, tertbutyl catechol, pyrogallol, copper resinate, β-naphthol, 2,6-di-tert-butyl-p-cresol, 2,2'-methylene-bis(4-ethyl-6-t-butylphenol), p-tolylquinone, chloranil, aryl phosphites, and aryl alkyl phosphites. Other useful thermal polymerization inhibitors will be apparent to those skilled in the art.

The carboxyl group containing film-forming polymeric binder useful in accordance with this invention is prepared from one or more film-forming, vinyl type monomers and one or more alpha, beta ethylenically unsaturated carboxyl group containing monomers having 3–15 carbon atoms, which makes the binder soluble in aqueous media. Examples of useful vinyl type monomers are alkyl and hydroxyalkyl acrylates and methacrylates having 3–15 carbon atoms, styrene, and alkyl substituted styrenes. The acrylates and methacrylates are preferred. Examples of useful carboxyl group-containing monomers are cinnamic acid, crotonic acid, sorbic acid, acrylic acid, methacrylic acid, itaconic acid, propiolic acid, maleic acid, fumaric acid, and half esters and anhydrides of these acids. Acrylic acid and methacrylic acid are preferred. Examples of useful binders are found in U.S. Pat. Nos. 4,539,286 and 4,985,343, the disclosures of which are incorporated herein by reference. Other useful binders will be apparent to those skilled in the art.

In a preferred embodiment, a monofunctional carboxyl group-containing addition-polymerizable monomer is added to the photopolymerizable composition of the instant invention. The monofunctional (i.e., containing one ethylenic double bond) carboxyl group containing monomer is preferably used because the photopolymerized material made from the photopolymerizable composition is then strippable from a substrate in small pieces, while without this monomer, the photopolymerized material strips well, but in large sheets. Stripping in small pieces is preferred since the photopolymerized material between fine lines is more easily removed. Also, some stripping apparatuses have filtration systems that could have clogging problems if stripping occurs in large sheets. Based on the weight of the photopolymerizable composition of the instant invention, the amount of the monofunctional carboxyl group-containing addition-polymerizable monomer used is preferably from about 1% to about 10%, more preferably from about 1.5% to about 6%. Useful monofunctional carboxyl group-containing addition-polymerizable monomers are, for example, itaconic acid, beta-carboxyethylacrylate, citraconic acid, crotonic acid, monomethacryloyloxyethyl phthalate, monoacryloyloxyethyl phthalate, and fumaric acid. Itaconic acid and beta-carboxyethylacrylate are preferred. Other useful monomers will be apparent to those skilled in the art.

The photopolymerizable composition of this invention optionally includes additives well known in the art of photopolymerizable compositions, such as leuco (i.e., printout) dyes, background dyes, adhesion promoters, and antioxidants as disclosed in U.S. Pat. No. 4,297,435, incorporated herein by reference, and the heretofore mentioned U.S. Pat. No. 4,268,610. Other optional additives will be apparent to those skilled in the art. While desirable, the optional additives are not essential to the instant invention.

The photopolymerizable composition of this invention is prepared by mixing the various components in a solvent. Suitable solvents are alcohols, ketones, halogenated hydrocarbons, and ethers. Other solvents will be apparent to those skilled in the art. After mixing, the composition is then coated onto a support or carrier, and the solvent is evaporated. The photopolymerizable composition has a preferable thickness of 25.4–50.8 μm. Carriers are preferably about 0.0254–0.0508 mm thick. U.S. Pat. Nos. 3,469,982 and 4,293,635, incorporated herein by reference, disclose useful methods for preparing the photopolymerizable composition of this invention, i.e., as rolls of dry film sandwiched between a flexible support member and a flexible cover member. It will be apparent to those skilled in the art that dry films of the instant invention can be made on inflexible supports as well as flexible supports and may be supplied as stacks of laminated sheets as disclosed in the heretofore mentioned U.S. Pat. No. 4,268,610, as well as rolls.

In a preferred embodiment, the photopolymerizable composition of this invention is used as a photoresist in the manufacture of printed circuit boards. Generally, the composition is coated onto the copper surface of a copper clad substrate, exposed to actinic radiation through a negative to create a latent image of photopolymerized material, and developed in a known aqueous developing solution to remove the unpolymerized composition from the copper surface. The portions of the surface not covered by the photopolymerized material are then modifiable by known processes, e.g., by plating or etching procedures, while the photoresist protects the covered surface. The photopolymerized material can be ultimately removed from the substrate by washing with known stripping solutions.

The photopolymerizable composition of the instant invention is applied to the copper clad substrate by known procedures, such as hot shoe or hot roll lamination of the dry film attached to a transparent, peelable support, which support is removed after polymerization, as disclosed in the heretofore mentioned U.S. Pat. No. 4,293,635. Generally, the amount of actinic radiation used to polymerize the composition varies from about 35 to about 150 mJ/cm², with precise amounts determinable by those skilled in the art based on the specific composition used.

The copper clad substrate is any known copper/dielectric laminate used in circuit board manufacture, such as a copper clad board of fiberglass reinforced epoxy resin. Other useful dielectrics will be apparent to those skilled in the art.

The aqueous developing solutions used in accordance with this invention have, by weight, about 0.5–10% alkaline agents, preferably about 0.5–1%, and the latent imaged board is washed in the solution for a time sufficient to remove the unpolymerized composition. Useful alkaline agents are alkali metal hydroxides, e.g., lithium, sodium and potassium hydroxide, the base reacting alkali metal salts of weak acids, e.g., sodium carbonate and bicarbonate, and alkali metal phosphates and pyrophosphates. Sodium carbonate is preferred. The circuit board can be submerged in the developing solution or, preferably, the solution is high pressure sprayed on the board.

In general, the stripping solutions useful in removing the photopolymerized material in accordance with the instant invention are heated alkaline aqueous solutions, for example, solutions containing the same alkaline agents as the developing solutions, but having a higher alkaline concentration, i.e., generally, by weight, from about 1%–10%, preferably from about 1%–3%. Generally, the stripping solution is heated to a temperature of about 45° C.–65° C., preferably about 50° C.–55° C. Washing the substrate to remove the photopolymerized material is by methods well known to those skilled in the art, such as spraying the substrate with the heated stripping solution or, preferably, agitating the substrate in a heated bath of the stripping solution.

Examples of the photoimaging techniques and equipment, including radiation sources, exposure intensity and duration, developing and stripping solutions and techniques, and laminated board composition useful in the preferred embodiment are disclosed in the heretofore described U.S. Pat. Nos. 3,469,982, 4,293,635, and 4,268,610.

In order to more clearly describe the present invention, the following non-limiting examples are provided. All parts and percentages in the examples are by weight unless indicated otherwise.

EXAMPLES 1–3

These examples demonstrate the effect of concentration of a hydroxyl-modified vinyl chloride/vinyl acetate polymer on adhesion of a photopolymerizable composition to a polyester carrier. Photopolymerizable compositions are prepared from the formulations described in the following Table 1. The compositions are prepared by blending the materials for about one hour using a propeller stirrer. Drawdowns of the film are made on a 92-gauge polyester sheet at a thickness of about 38.1 µm thickness. Samples are evaporated by storing in a ventilated cabinet for 4–18 hours. The samples are then laminated to copper-clad epoxy/glass boards. The resist is cut with a razor in one-inch strips to prepare the material for peel strength measurements. Measurements are made using a 180° peel strength test on an Instrom filled with a 0.9 kg load cell. A minimum of ten measurements are made for each sample. The reported peel strengths are an average of the ten measurements. For comparison, a control without any additive is prepared and tested according to the same procedure. Results are reported in Table 1.

TABLE 1

| | Parts | | | |
|---|---|---|---|---|
| | Control | Ex. 1 | Ex. 2 | Ex. 3 |
| acrylic binder[1] | 79.86 | 79.46 | 79.06 | 78.28 |
| glycerol propoxy triacrylate | 16.17 | 16.09 | 16.01 | 15.85 |
| benzophenone | 1.31 | 1.31 | 1.30 | 1.29 |
| Michler's ketone | 0.05 | 0.05 | 0.05 | 0.05 |
| n-phenyl glycine | 0.05 | 0.05 | 0.05 | 0.05 |
| BHT[2] | 0.02 | 0.02 | 0.02 | 0.02 |
| tri-n-butyl citrate | 2.22 | 2.21 | 2.20 | 2.18 |
| brilliant green dye | 0.06 | 0.06 | 0.06 | 0.06 |
| adhesion agent[3] | 0.00 | 0.22 | 0.43 | 0.89 |
| peel strength[4] | 10.4 | 240.6 | 440.4 | 699.2 |

[1]13% ethyl acrylate, 65% methyl methacrylate, 22% methacrylic acid, made as in Synthesis Example of U.S. Pat. No. 4,985,343, except that methyl ethyl ketone (MEK) is used instead of isopropyl alcohol, and the final material is adjusted to 31% solids.
[2]Butylated hydroxy toluene
[3]Molecular weight 27,000, partially hydrolyzed hydroxyl-modified vinyl chloride/vinyl acetate copolymer, about 90% vinyl chloride, 4% vinyl acetate, 2.3% hydroxyl content, available under the name UCAR VAGH from Union Carbide.
[4]g/2.54 cm width The results demonstrate the dramatic increase in adhesion evidenced by use of the hydroxyl-modified vinyl chloride/vinyl acetate polymer in accordance with the present invention.

EXAMPLES 4–6

Samples are prepared and tested as in Examples 1–3 using the formulations in Table 2 below.

TABLE 2

| | Parts | | | |
|---|---|---|---|---|
| | Control | Ex. 4 | Ex. 5 | Ex. 6 |
| acrylic binder[1] | 79.86 | 79.46 | 79.06 | 78.28 |
| glycerol propoxy triacrylate | 16.17 | 16.09 | 16.01 | 15.85 |
| benzophenone | 1.31 | 1.31 | 1.30 | 1.29 |
| Michler's ketone | 0.05 | 0.05 | 0.05 | 0.05 |
| n-phenyl glycine | 0.05 | 0.05 | 0.05 | 0.05 |
| BHT[2] | 0.02 | 0.02 | 0.02 | 0.02 |
| tri-n-butyl citrate | 2.22 | 2.21 | 2.20 | 2.18 |
| brilliant green dye | 0.06 | 0.06 | 0.06 | 0.06 |
| adhesion agent[3] | 0.00 | 0.50 | 1.00 | 2.00 |
| peel strength[4] | 14.1 | 286.0 | 422.2 | 458.5 |

[1]As in Examples 1–3
[2]Molecular weight 22,000, partially hydrolyzed hydroxyl-modified vinyl chloride/vinyl acetate copolymer, about 90% vinyl chloride, 4% vinyl acetate, 2.3% hydroxyl content, available under the name UCAR VAGD from Union Carbide.
[4]g/2.54 cm width

EXAMPLE 7

This example demonstrates a dry film photopolymerizable composition made in accordance with the present invention that is provided as a roll of material in which the composition is sandwiched between a polyester carrier film and a polyethylene cover film. A photopolymerizable composition is prepared using the following ingredients: 77 parts acrylate polymer (31% solids) as in Examples 1–3; 0.23 parts UCAR VAGD; 3% methoxylated Bisphenol A dimethacrylate (available under the name BPE 500 from Shin-Nakamura Chemical Co. Ltd.); 2.9 parts urethane polymer having an acid number 10.2 made by reacting a mixture of 29 parts propylene glycol polymer (2000 molecular weight, available from Olin Chemical Co. under the name Poly G 20-56), 2 parts bishydroxymethylpropionic acid, and 43 parts ethylene oxide/propylene oxide block copolymer (2000 molecular weight available from Olin Chemical Co. under the name Poly G 55-53), after the reactants are dried under nitrogen for about 12 hours at 60° C., at 75°–80° C. in a nitrogen atmosphere in the presence of 0.015 parts dioctyltin bis(isooctylmercaptoacetate) and 14 parts toluene diisocyanate until the isocyanate content is 1.8% following which 4 parts 2-hydroxypropylmethacrylate (containing 0.10% BHT) and 0.015 parts dioctyltin bis(isooctylmercaptoacetate) are added under an air atmosphere and the reaction continued until completion; 7 parts trimethylolpropane triacrylate (Sartomer Chemical Co.) 1.5 parts dimethoxyphenyl acetophenone (Ciba-Geigy); 0.3 parts isopropyl thioxanthone (Aceto Chemical Co.); 1.5 parts ethyl dimethylaminobenzoate (Aceto Chemical Co.); 0.6 parts pentabromomonochlorocyclohexane (PBCH, available from Nissei Chemical Company, Japan); 0.6 parts ethoxylated ethylene diamine (available under the name QUADROL from BASF Corporation, Chemical Division, Parsippany, N.J.); 0.02 parts butylated hydroxytoluene; 0.4 parts itaconic acid; 0.08 parts diethanolamine-modified tolyl triazole (available under the name REOMET 42 from Ciba-Geigy Corporation, Hawthorne, N.Y.); 0.05 parts first dye solution (2.44% Brilliant Green, 6.27% Victoria Blue, and 91.29% methanol); 0.4 parts second dye solution (5% Brilliant Green and 95% methanol); and 0.2 parts Leuco Crystal Violet. The composition is mixed thoroughly, coated on a 92 gauge transparent polyester film, and dried as in Examples 1–3. The dry material is then laminated with a 25.4 µm thick polyethylene cover film and rolled into a roll around a cylindrical core.

EXAMPLE 8

This example demonstrates a further embodiment in accordance with the present invention in which a dry film photopolymerizable composition is provided as a roll of material in which the resist is sandwiched between a polyester carrier film and a polyethylene cover film. A photopolymerizable composition is prepared using the following ingredients: 78 parts acrylate polymer (31% solids) as in Examples 1–3; 0.23 parts UCAR VAGH; 3% glycerol propoxy triacrylate; 2.9 parts urethane polymer as in Example 7; 7 parts trimethylolpropane triacrylate; 2.5 parts benzophenone; 0.13 parts Michler's ketone; 1.5 parts ethyl dimethylaminobenzoate; 0.6 parts pentabromomonochlorocyclohexane; 0.6 parts ethoxylated ethylene diamine; 0.02 parts butylated hydroxytoluene; 0.08 parts diethanolamine-modified tolyl triazole; 0.05 parts first dye solution (2.44% Brilliant Green, 6.27% Victoria Blue, and 91.29% methanol); 0.4 parts second dye solution (5% Brilliant Green and 95% methanol); and 0.2 parts Leuco Crystal Violet. The composition is mixed thoroughly and rolls of dry film made as in Example 7.

EXAMPLE 9

This example demonstrates a further embodiment in accordance with the present invention in which a dry film photopolymerizable composition is provided as a roll of material in which the resist is sandwiched between a polyester carrier film and a polyethylene cover film. A photopolymerizable composition is prepared using the following ingredients: 168 parts styrene monobutyl maleate copolymer (available from Monsanto Company under the designation SMA 640); 2.8 parts vinyl chloride/vinyl acetate/hydroxyalkylacrylate terpolymer (available from Union Carbide under the designation UCAR VYES-4; 99 parts ethoxylated trimethylolpropane triacrylate; 0.031 parts butylated hydroxytoluene; 2.52 parts isopropyl thioxanthone; 3.78 parts ethyl dimethylaminobenzoate; 3.78 parts benzophenone; 137 parts methanol; 79.98 parts methyl ethyl ketone; and 0.4 parts Brilliant Green dye. The composition is mixed thoroughly and rolls of dry film made as in Example 7.

Claimed is:

1. An aqueous alkaline-developable dry film photopolymerizable composition, which composition comprises a hydroxyl modified copolymer of vinyl chloride/vinyl acetate, said hydroxyl modified copolymer being present in an mount of 0.5 to 2 percent based on the weight of the dry-film photopolymerizable composition.

2. The photopolymerizable composition of claim 1 further comprising:
   (a) a carboxyl group containing, film-forming polymeric binder;
   (b) a free radical photoinitiator;
   (c) a polyfunctional addition-polymerizable monomer;
   (d) a plasticizer; and
   (e) a thermal polymerization inhibitor.

3. The photopolymerizable composition of claim 2 wherein the hydroxyl modified copolymer contains from 1 to 15 weight percent groups.

4. The photopolymerizable composition of claim 2 wherein the hydroxyl modified copolymer contains from 2 to 4 weight percent groups.

5. The photopolymerizable composition of claim 1 wherein the hydroxyl modified copolymer is present in an mount of 0.5 to 1 percent based on the weight of the dry-film photopolymerizable composition.

6. The photopolymerizable composition of claim 1 wherein the hydroxyl modified copolymer contains from 1 to 15 weight percent groups.

7. The photopolymerizable composition of claim 1 wherein the hydroxyl modified copolymer contains from 2 to 4 weight percent hydroxyl groups.

8. An article comprising an aqueous alkaline-developable dry-film photopolymerizable composition which composition comprises a hydroxyl modified copolymer of vinyl chloride/vinyl acetate, said hydroxyl modified copolymer being present in an mount of 0.5 to 2 percent based on the weight of the dry-film photopolymerizable composition and wherein said photopolymerizable composition is disposed on a carrier.

9. An article according to claim 8 wherein the photopolymerizable composition further comprises:
   (a) a carboxyl containing, film forming polymeric binder;
   (b) a free radical photoinitiator;
   (c) a polyfunctional addition-polymerizable monomer;
   (d) a plasticizer; and
   (e) a thermal polymerization inhibitor.

10. An article according to claim 9 wherein the carrier is a flexible polyester film.

11. An article according to claim 9 wherein the hydroxyl modified copolymer is present in an amount of 0.5 to 1 percent based on the weight of the dry-film photopolymerizable composition.

12. An article according to claim 8 wherein the hydroxyl modified copolymer is present in an amount of 0.5 to 1 percent based on the weight of the dry-film photopolymerizable composition.

13. An article according to claim 8 wherein the carrier is a flexible polyester film.

14. An article according to claim 8 wherein the article comprises the photopolymerizable composition sandwiched between a flexible carrier film and a flexible cover film.

15. An article according to claim 8 wherein the hydroxyl modified copolymer contains from 1 to 15 weight percent hydroxyl groups.

16. An article according to claim 8 wherein the hydroxyl modified copolymer contains from 2 to 4 weight percent hydroxyl groups.

17. An article according to claim 8 wherein the carrier is an inflexible support.

* * * * *